United States Patent
Lim et al.

(10) Patent No.: US 11,836,606 B2
(45) Date of Patent: Dec. 5, 2023

(54) NEURAL PROCESSING UNIT AND ELECTRONIC APPARATUS INCLUDING THE SAME

(71) Applicant: SAMSUNG ELECTRONICS CO., LTD., Suwon-si (KR)

(72) Inventors: Jin Soo Lim, Seoul (KR); Chang Kyu Seol, Osan-si (KR); Jae Hun Jang, Hwaseong-si (KR); Hye Jeong So, Hwaseong-si (KR); Hong Rak Son, Anyang-si (KR); Pil Sang Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 768 days.

(21) Appl. No.: 16/778,168

(22) Filed: Jan. 31, 2020

(65) Prior Publication Data

US 2021/0133543 A1 May 6, 2021

(30) Foreign Application Priority Data

Oct. 30, 2019 (KR) .................. 10-2019-0136595

(51) Int. Cl.
*G06N 3/063* (2023.01)
*G11C 11/419* (2006.01)
*G06F 7/544* (2006.01)
*G06N 20/00* (2019.01)

(52) U.S. Cl.
CPC .......... *G06N 3/063* (2013.01); *G06F 7/5443* (2013.01); *G06N 20/00* (2019.01); *G11C 11/419* (2013.01)

(58) Field of Classification Search
CPC .......... G06N 3/063; G06N 20/00; G06N 3/04; G06F 7/5443; G06F 3/0658; G06F 3/0679; G06F 8/63; G06F 15/7871; G11C 11/419; G11C 11/54; G10L 13/08; G10L 15/02
See application file for complete search history.

(56) References Cited

U.S. PATENT DOCUMENTS

| | | | |
|---|---|---|---|
| 7,660,941 B2 | 2/2010 | Lee et al. | |
| 9,391,893 B2 | 7/2016 | Bhardwaj | |
| 9,514,404 B1 | 12/2016 | Corrado et al. | |
| 9,652,157 B2 | 5/2017 | Fisher et al. | |
| 9,727,459 B2 | 8/2017 | Khoueir et al. | |
| 9,996,460 B2 | 6/2018 | Lee et al. | |
| 11,023,360 B2 * | 6/2021 | Gu | G06F 30/27 |
| 11,042,414 B1 * | 6/2021 | Byagowi | G06F 9/505 |
| 11,328,207 B2 * | 5/2022 | Lauterbach | G06N 3/105 |
| 11,461,651 B2 * | 10/2022 | Kale | G06N 5/04 |

(Continued)

FOREIGN PATENT DOCUMENTS

WO 2019067964 4/2019

*Primary Examiner* — Nha T Nguyen
(74) *Attorney, Agent, or Firm* — F. Chau & Associates, LLC

(57) ABSTRACT

A storage device is provided including an interface circuit configured to receive application information from a host; a field programmable gate array (FPGA); a neural processing unit (NPU); and a central processing unit (CPU) configured to select a hardware image from among a plurality of hardware images stored in a memory using the application information, and reconfigure the FPGA using the selected hardware image. The NPU is configured to perform an operation using the reconfigured FPGA.

13 Claims, 19 Drawing Sheets

(56) References Cited

U.S. PATENT DOCUMENTS

| | | | |
|---|---|---|---|
| 11,488,004 B2* | 11/2022 | Lie | G06N 3/08 |
| 2003/0086300 A1* | 5/2003 | Noyes | G06F 9/547 |
| | | | 365/230.01 |
| 2007/0094481 A1* | 4/2007 | Snook | G06N 3/063 |
| | | | 712/200 |
| 2016/0247080 A1 | 8/2016 | Trantham et al. | |
| 2018/0157465 A1* | 6/2018 | Bittner | G06F 7/52 |
| 2019/0138890 A1* | 5/2019 | Liang | G06N 3/0445 |
| 2019/0286973 A1* | 9/2019 | Kovvuri | G06N 3/04 |
| 2019/0325296 A1* | 10/2019 | Fowers | G06N 3/0454 |
| 2019/0325297 A1* | 10/2019 | Fowers | G06N 3/0454 |
| 2020/0174748 A1* | 6/2020 | Roberts | G06N 3/063 |
| 2020/0210838 A1* | 7/2020 | Lo | G06F 9/30025 |
| 2020/0242474 A1* | 7/2020 | Lo | G06N 3/063 |
| 2020/0264876 A1* | 8/2020 | Lo | G06K 9/6262 |
| 2020/0272882 A1* | 8/2020 | Lo | G06N 3/04 |
| 2020/0293868 A1* | 9/2020 | Mital | G06N 3/08 |
| 2021/0064975 A1* | 3/2021 | Purandare | G06F 30/27 |
| 2021/0133577 A1* | 5/2021 | Srinivasan | G06N 3/063 |

\* cited by examiner

NEURAL PROCESSING UNIT AND ELECTRONIC APPARATUS INCLUDING THE SAME

CROSS-REFERENCE TO RELATED APPLICATIONS

This U.S. non-provisional patent application claims priority under 35 USC § 119 to Korean Patent Application No. 10-2019-0136595, filed on Oct. 30, 2019, in the Korean Intellectual Property Office, the disclosure of which is incorporated by reference in its entirety herein.

BACKGROUND

1. Technical Field

The present disclosure relates to an electronic apparatus, and more particularly, to an electronic apparatus including a neural processing unit.

2. Discussion of Related Art

Artificial intelligence (AI) functions have been utilized in various fields. For example, artificial intelligence functions may be used to perform speech recognition and image classification in various electronic apparatuses such as personal computers, laptops, tablets, smartphones, and digital cameras. AI functions typically perform complex and timing consuming computational operations. A computational circuit having a high operating speed and a large-capacity high-speed memory for processing data may be required to implement these computational operations. However, the computational circuit is typically very expensive and takes up a lot of physical space. Accordingly, artificial intelligence functions are typically performed using a remote data center that has access to one or more of these computational circuits.

SUMMARY

At least one embodiment of the present disclosure provide a reconfigurable neural processing unit and an electronic apparatus including the same.

According to an exemplary embodiment of the inventive concept, a storage device is provided including: an interface circuit configured to receive application information from a host; a field programmable gate array (FPGA); a neural processing unit (NPU); and a central processing unit (CPU) configured to select a hardware image from among a plurality of hardware images stored in a memory using the application information, and reconfigure the FPGA using the selected hardware image. The NPU is configured to perform an operation using the reconfigured FPGA.

According to an exemplary embodiment of the inventive concept, a storage controller is provided including: a neural processing unit (NPU); a field programmable gate array (FPGA); a nonvolatile memory (NVM) controller connected to a NVM device located outside the storage controller via a dedicated channel, the NVM device storing a plurality of hardware images; and a data bus connecting the NPU, the FPGA, and the NVM controller. The NVM controller selects one of the hardware images corresponding to received application information from the NVM device, and reconfigures the FPGA using the selected hardware image.

According to an exemplary embodiment of the inventive concept, a mobile device is provided including: a host device; a storage device having a device controller and a nonvolatile memory (NVM) storing a plurality of hardware images, the device controller having a first neural processing unit (NPU); and an interface circuit configured to enable the host device and the storage device to communicate with one another. The device controller is configured to select a hardware image from among the plurality of hardware images using application information received from the host device, and reconfigure a field programmable gate array (FPGA) of the first NPU using the selected hardware image.

According to an exemplary embodiment of the inventive concept, a method of operating a neural processing unit (NPU) includes: receiving, by the NPU, application information and data from a host device; selecting, by the NPU, one of a plurality of hardware images from a memory using the application information; loading, by the NPU, the selected hardware image to a field programmable gate array (FPGA) within the NPU to configure the FPGA; and performing, by the NPU, a machine learning algorithm associated with the application information on the data to generate a result using the configured FPGA.

BRIEF DESCRIPTION OF THE DRAWINGS

Aspects and features of the present disclosure will become more apparent by describing exemplary embodiments thereof in detail with reference to the attached drawings, in which.

DETAILED DESCRIPTION OF THE EXEMPLARY EMBODIMENTS

Figure 1:
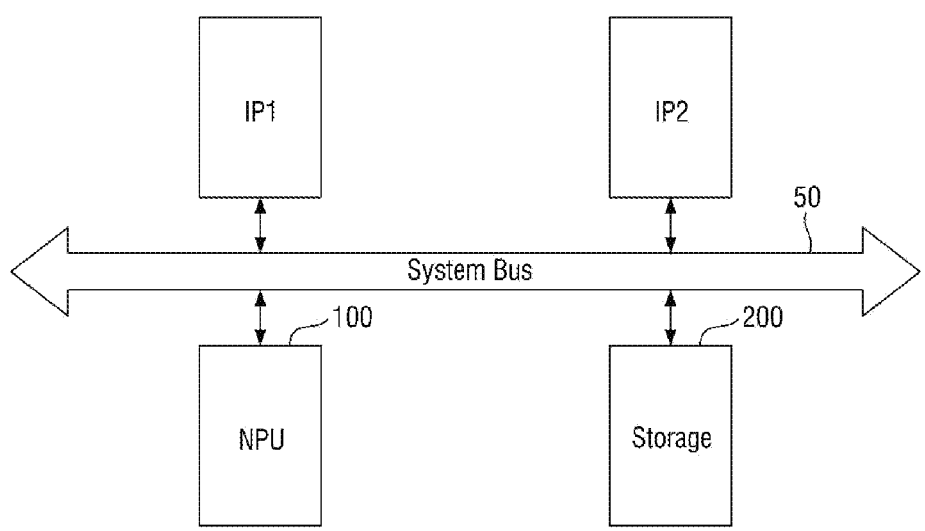
FIG. 1 is a block diagram showing a computing system according to an exemplary embodiment of the inventive concept.

The terms "unit," "module," and the like used herein or the functional blocks shown in the drawings may be implemented in the form of hardware, software, or a combination thereof configured to perform a specific function.

In the present disclosure, a hardware image I is a hardware/software image for a specific operation performed by a field-programmable gate array (FPGA) and may be referred to as a bitstream, a kernel, or a lookup table depending on various embodiments.

In the present disclosure, an image refers to a static image being displayed or a dynamic image changing over time.

FIG. 1 is a block diagram illustrating a computing system according to an exemplary embodiment of the inventive concept.

Referring to FIG. 1, an electronic apparatus 1 includes a plurality of intellectual properties (IPs) and a neural network processing unit (NPU) 100. The IPs may be semiconductor intellectual property cores, IP cores, or IP blocks. The IPs may be a reusable unit of logic, a cell, or an integrated circuit layout design that is the intellectual property of one party.

The electronic apparatus 1 may be designed to perform various functions in a semiconductor system. For example, the electronic apparatus 1 may include an application processor. The electronic apparatus 1 may analyze input data on the basis of a neural network in real-time and extract valid information. For example, the electronic apparatus 1 may apply the input data to the neural network to generate a prediction. The electronic apparatus 1 may perform a situation determination based on the extracted information or may control elements of an electronic device in communication with the electronic apparatus 1. In an example embodiment, the electronic apparatus 1 may be applied to one or more computing apparatuses that perform various computational functions. For example, the electronic apparatus 1 may be applied to a robot apparatus such as a drone, an advanced driver assistance system (ADAS), a smart TV, a smartphone, a medical device, a mobile device, an image display device, a measuring device, or an Internet of things (IoT) device. Furthermore, the electronic apparatus 1 may be installed in at least one of various kinds of electronic devices.

The electronic apparatus 1 may include various kinds of IPs. For example, the IPs may include a processing unit, a plurality of cores included in a processing unit, a multi-format codec (MFC), a video module (e.g., a camera interface, a Joint Photographic Experts Group (JPEG) processor, a video processor, or a mixer), a 3D graphic core, an audio system, a driver, a display driver, a volatile memory, a non-volatile memory, a memory controller, an input/output interface block, and a cache memory.

As a technique for connecting IPs, a connection scheme based on a system bus 50 is mainly utilized. For example, the Advanced Microcontroller Bus Architecture (AMBA) protocol of ARM Holdings PLC may be applied as a standard bus specification. The bus type of the AMBA protocol may include Advanced High-Performance Bus (AHB), Advanced Peripheral Bus (APB), Advanced eXtensible Interface (AXI), AXI4, and AXI Coherency Extensions (ACE). Among the above bus types, the AXI may provide a multiple outstanding address function, a data interleaving function, and the like as an interface protocol between IPs. In addition, other types of protocols such as uNetwork of SONICs Inc., CoreConnect of IBM, and Open Core Protocol of OCP-IP may be applied to the system bus 50.

The neural processing unit 100 may generate a neural network, train (or learn) the neural network, operate the neural network on input data to generate a prediction, or retrain the neural network. That is, the neural processing unit 100 may perform a complex computation necessary for deep learning or machine learning.

In an exemplary embodiment of the inventive concept, the neural processing unit 100 include an FPGA (e.g., 300, 140, 25, etc.). The FPGA 300 may perform an additional computation for the complex computation performed by the neural processing unit 100 (e.g., a neural processor). For example, the neural processing unit 100 may offload one its tasks or a part of a task to the FPGA. The FPGA may include a plurality of programmable gate arrays. The FPGA may reconfigure one or more of the gate arrays by loading a hardware image I. The hardware image I may correspond to a particular application. An additional computation necessary for the corresponding application may be processed according to the reconfigured gate array. This will be described in more detail below. The additional computation may be a pre-computation, an intermediate computation, or a post-computation necessary for the neural processing unit 100 to perform the complex computation. For example, during speech recognition, a pre-computation may be used to extract features from an audio signal being analyzed so they can later be applied to a neural network during an intermediate computation. For example, during a text-to-speech operation, the post-computation may be used to synthesize a speech waveform from the text.

The neural processing unit 100 may receive various kinds of application data from IPs through the system bus 50 and load an application-adapted hardware image I into the FPGA on the basis of the application data.

The neural processing unit 100 may perform complex computations associated with the generation, training, or re-training of a neutral network. However, an additional computation necessary for the corresponding complex computation may be performed by the FPGA, and thus the neural processing unit 100 may process various computations independently without the help of an application processor.

Figure 2:
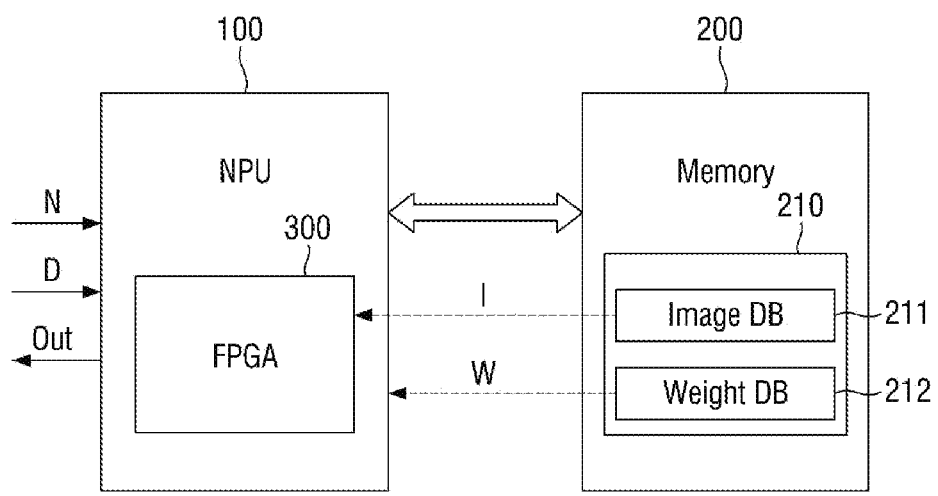
FIG. 2 is a diagram illustrating the operation of a neural processing unit according to an exemplary embodiment of the inventive concept.
Figure 3:
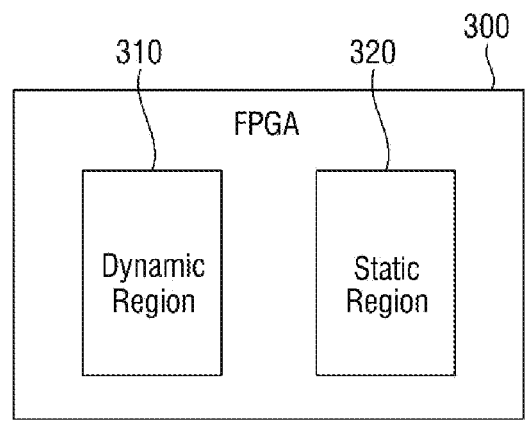
FIG. 3 is a diagram illustrating a configuration of a field-programmable gate array (FPGA) according to an exemplary embodiment of the inventive concept.

FIG. 2 is a diagram illustrating the operation of a neural processing unit according to an exemplary embodiment of the inventive concept, and FIG. 3 is a diagram illustrating a configuration of an FPGA according to an exemplary embodiment of the inventive concept.

Referring to FIG. 2, the electronic apparatus 1 according to an exemplary embodiment of the inventive concept includes a neural processing unit 100 and a memory 200.

The neural processing unit 100 receives application information N and data D from an external apparatus such as the IPs shown in FIG. 1, processes a computation requested by an application of an IP to generate a computation result Out, and outputs the computation result Out to the corresponding external apparatus. In an exemplary embodiment, the neural processing unit 100 loads a hardware image I corresponding to the application information N, which is stored in the memory 200, into the FPGA 300 to reconfigure one or more gate arrays of the FPGA 300. For example, the hardware image I may be an electronic file such as a FPGA bitstream containing programming information for the FPGA 300. The FPGA 300 having the reconfigured gate array(s) performs computations on the data D to generate the computation result Out, and then outputs the result Out. The performing of the computations may include use of weight information W. For example, if the computation involves an operation performed by a node (or neuron) of a neural network to sum a set of inputs, some of these inputs may be modified (e.g., multiplied) by weights in the weight information W before the sum is calculated. For example, if one of the inputs should be considered more than the other inputs in making a prediction, that input could receive a higher weight. According to an exemplary embodiment of the inventive concept, the FPGA 300 performs a pre-computation on the data D to generate a pre-computation result, and the neural processing unit 100 performs a complex computation on the pre-computation result using the weight information W to generate a result OUT, and then outputs the result OUT. For example, the complex computation may be an operation performed by a node of a neural network. According to an exemplary embodiment of the inventive concept, the neural processing unit 100 performs a complex computation on the data D using the weight information W to generate intermediate data, and the FPGA 300 performs a post-computation on the intermediate data to generate a result Out and then outputs the result Out. Since the result Out is based a previous computation that considered the weight information W, the result Out reflects the weight information W.

According to an exemplary embodiment of the inventive concept, the complex computation, which is requested by an application, is associated with an artificial intelligence function or a machine learning algorithm and may be, for example, a speech recognition, speech synthesis, image recognition, image classification, or natural language processing computation.

According to an exemplary embodiment of the inventive concept, when the data D is a user's speech (e.g., audio recorded during speaking of a human) and the external apparatus is an application (the application information N) using a speech recognition function, the neural processing unit 100 performs a computation for extracting a feature from the user's speech received from the external apparatus and outputs an analysis result based on the extracted feature to an application having a speech recognition function. In this case, the FPGA 300 may perform an additional computation for extracting the feature from the speech.

According to an exemplary embodiment, when the data D is a user's speech (e.g., audio) or script (e.g., text) and the external apparatus is an application (the application information N) using a natural language processing function, the neural processing unit 100 analyzes a speech or script received from the external apparatus using a word vector, performs a computation for natural language processing to generate a processed expression, and outputs the processed expression to an application using a natural language processing function. According to some embodiments, the application using the natural language processing function may be for speech recognition, summarizing, translation, user emotion analysis, text classification task, a question and answer (Q&A) system, or a chat-bot. In this case, the FPGA 300 may perform an additional computation for the natural language processing computation.

According to an exemplary embodiment, when the data D is a script and the external apparatus is an application (the application information N) using a text-to-speech (TTS) function, the neural processing unit 100 performs a text-to-phoneme (TTP) conversion, grapheme-to-phoneme (GTP) conversion computation, or prosodeme adjustment on a script received from the external apparatus to generate a speech synthesis result and outputs the speech synthesis result to the application using the TTS function. In this case, the FPGA 300 may perform an additional computation for the speech synthesis computation.

According to an exemplary embodiment of the inventive concept, when the data D is an image and the external apparatus is an application (the application information N) using an image processing function, the neural processing unit 100 performs an activation computation on an image received from the external apparatus to generate a result and outputs the result to the application using the image processing function. According to an exemplary embodiment of the inventive concept, the activation computation may be a nonlinear function computation. Examples of a nonlinear function include a tangent hyperbolic (Tanh) function, a sigmoid function, a Gaussian error linear unit (GELU) function, an exponential function, and a logarithm function. In this case, the FPGA 300 may perform an additional computation for the activation computation.

As illustrated in FIG. 2, the neural processing unit 100 includes the FPGA 300. The FPGA 300 is a programmable logic device configured based on a hardware image I. The FPGA 300 may include at least one of a configurable logic block (CLB), an input-output block (JOB), and a configurable connection circuit for connecting the two components according to some embodiments. For example, a CLB may be configured to perform complex combinational functions or configured as simple logic gates such as AND, NAND, OR, NOR, XOR, etc. For example, a CLB could also be configured as a memory element such as a flip-flop.

Referring to FIGS. 2 and 3, loading a hardware image I to the FPGA 300 may cause the FPGA 300 to be reconfigured according to a surrounding environment. That is, the FPGA 300 may be reconfigured by being programmed according to the hardware image I.

According to an exemplary embodiment of the inventive concept, the FPGA 300 includes a dynamic region 310 and a static region 320.

In the dynamic region 310, a specific operation may be performed according to the hardware image I loaded according to the application information N. The FPGA 300 in the dynamic region 310 may be a programmable logic device that is widely used to design a digital circuit dynamically reconfigured through the hardware image I to perform a specific operation.

In the static region 320, a specific operation is performed without loading a hardware image I. The FPGA 300 in the static region 320 may perform operations that correspond to simple computations or operations that have to be frequently performed regardless of the application. In an example embodiment, a nonlinear function computation for an operation that is frequently performed in artificial intelligence and deep learning regardless of the application may be included in the static region 320. Some examples of a nonlinear function may include a tangent hyperbolic (Tanh) function, a sigmoid function, a Gaussian error linear unit (GELU) function, an exponential function, a logarithm function, etc.

For example, when the hardware image I associated with an application is loaded to the FPGA 300, blocks of the dynamic region 310 are reconfigured and no block of the static region 320 is reconfigured. However, the static region 320 may be initially configured or reconfigured upon power-up of the system to perform the simple computations.

As shown in FIG. 2, the memory 200 stores data necessary for the operation of the neural processing unit 100. According to an exemplary embodiment of the inventive concept, the memory 200 includes a reconfiguration information database 210 configured to store information necessary for computations for artificial intelligence functions. In an exemplary embodiment, the memory 200 stores a plurality of different machine learning algorithms and the application information N indicates one of the machine learning algorithms for a neural processing unit 100 or for a processor 120 to select. For example, one of the machine learning algorithms may be used for speech recognition, another one of the machine learning algorithms may be used for image recognition, etc. Each of the machine learning algorithms may include a different type of neural network. For example, a hardware image I could be used to implement one of the machine learning algorithms.

According to an exemplary embodiment of the inventive concept, the reconfiguration information database (DB) 210 includes an image database (DB) 211 including a plurality of hardware images I for reconfiguring the FPGA 300 and a weight DB 212 including a plurality of weight information W. According to an exemplary embodiment, the image DB 211 and the weight DB 212 may be independently included in the memory 200. Alternatively, the weight information W may be stored in association with the hardware image I, or the hardware image I and the weight information W may be stored in association with an application.

According to an exemplary embodiment, the reconfiguration information DB 210 stores at least one hardware image I and at least one weight information W through mapping to the application information N. According to an exemplary embodiment, the application information N, the hardware image I, and the weight information W are stored in the form of a mapping table and may be stored through association of the hardware image I and the weight information W with the application information N using pointers. For example, the application information N may be a unique integer identifying with one of a plurality of different applications, where entries of the mapping table are accessed using the integer. For example, if N=3 to reference a third application among the applications, then the third entry of the mapping table could be retrieved, where the retrieved entry identifies the hardware image and the weight information to be used for the third application.

Figure 4:
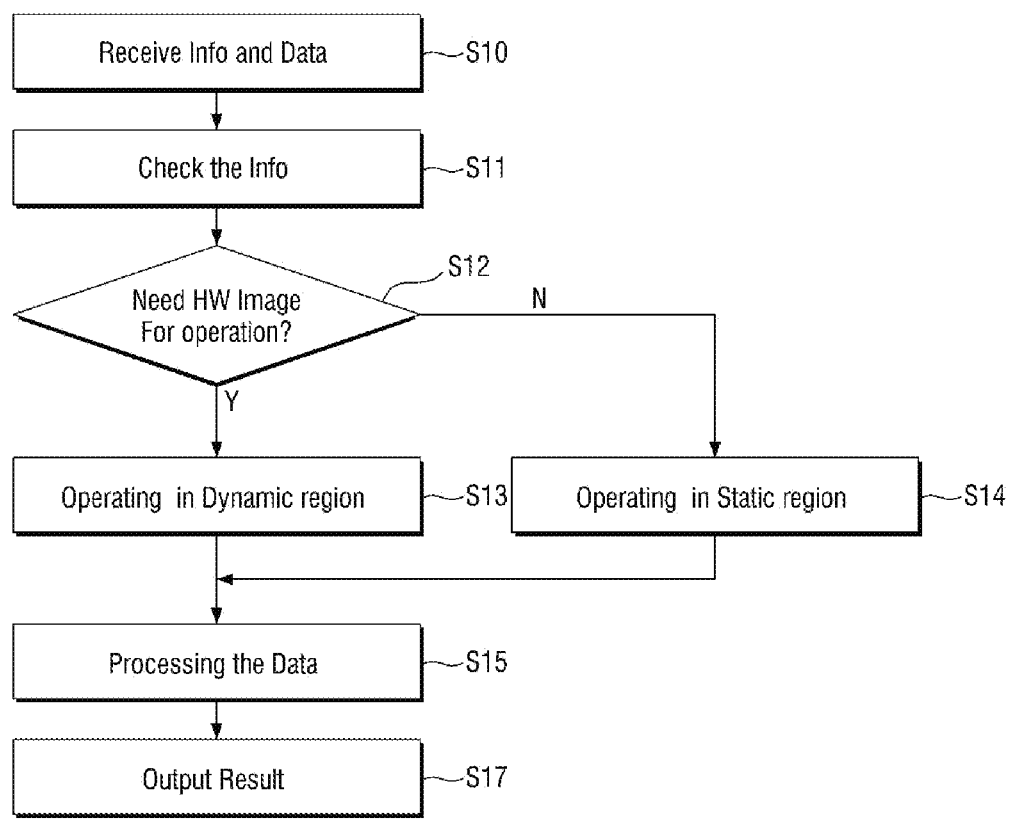
FIG. 4 is a flowchart illustrating an operating method of a neural processing unit according to an exemplary embodiment of the inventive concept.
Figure 5:
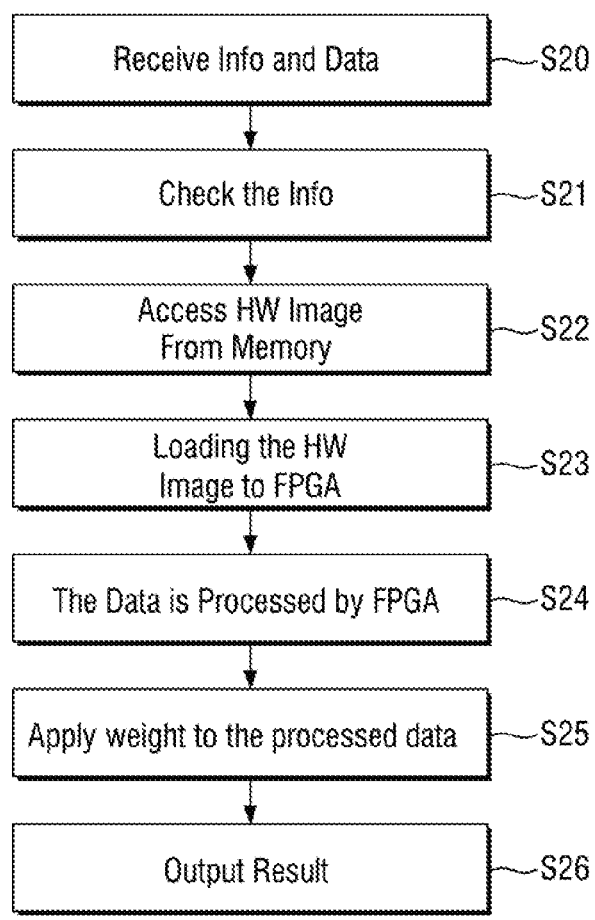
FIG. 5 is a flowchart illustrating an operating method of a neural processing unit according to an exemplary embodiment of the inventive concept.

FIG. 4 is a flowchart illustrating an operating method of a neural processing unit according to an exemplary embodiment of the inventive concept, and FIG. 5 is a flowchart illustrating an operating method of a neural processing unit according to an exemplary embodiment of the inventive concept.

Referring to FIG. 4, the external apparatus accesses a neural processing unit to perform an artificial intelligence function, for example, deep learning, and transmits application information N and data D. The neural processing unit receives the application information N and the data D (S10). The neural processing unit ascertains the application information N (S11) and checks whether there is a need to reconfigure the FPGA in order to output a result requested by a corresponding application (S12). That is, the neural processing unit checks whether there is a need to load a hardware image I. For example, if the next operation to execute needs only the computations provided by the static region 320, then it is not necessary to load the hardware image I.

According to an exemplary embodiment of the inventive concept, when a computation requested by a corresponding application requires reconfiguration of the FPGA 300, the neural processing unit 100 operates the FPGA 300 in the dynamic region 310 to generate data (S13). When the FPGA 300 is used without reconfiguration, the neural processing unit operates the FPGA 300 in the static region 320 to generate data (S14). The neural processing unit 100 processes the data to generate a result (S15) and then outputs the result (S17). For example, the neural processing unit 100 may output the result across the bus 50 to an IP (e.g., IP1) or to the storage device 200.

The operated region of the FPGA 300 performs a data computation to generate a processing result and outputs the processing result to the neural processing unit 100.

If the NPU 100 again receives the same application information N, the neural processing unit 100 can operate the FPGA 300 in either the dynamic region 310 or the static region 320.

In FIG. 5, steps S20 and S21 are the same as S10 and S11, respectively, and thus a description thereof will be omitted.

Referring to FIG. 5, when the FPGA 300 in the dynamic region 310 is operated, the neural processing unit 100 accesses a hardware image I corresponding to application information N among a plurality of hardware images I stored in a memory (S22) and loads the hardware image I into the FPGA (S23). For example, when it is necessary to reconfigure the dynamic region 310 based on the application information N, the hardware image I associated with the application information N is loaded to the dynamic region 310.

The FPGA 300 is reconfigured according to the loaded hardware image I. The reconfigured FPGA 300 processes data received from an external apparatus to generate processed data (S24). For example, the processing may be a pre-computation. The FPGA 300 may output the processed data to the neural processing unit 100. The neural processing unit 100 reads weight information W corresponding to the application information N from the memory 200. The neural processing unit 100 applies the weight information W to the processed data output by the FPGA (S25) to generate a result Out, and outputs the result Out to the external apparatus (S26). The result Out may include weighted data. For example, the processed data may be multiplied by one or more weights in the weight information W. For example, if the processed data includes a several features, these features could be multiplied by the weights to generate weighted features and then an operation can be performed on the weighted features to generate the result Out. For example, the operation could be one performed by a node or neuron of a neural network.

The neural processing unit 100 may more adaptively and efficiently process a pre-computation or a post-computation for each of various applications for performing an artificial intelligence function. Also, the neural processing unit 100 may adaptively reconfigure the FPGA 300 according to an FPGA application to perform an additional computation necessary to perform a complex computation. Accordingly, it is possible to reduce dependence on an application processor or an external processing apparatus when the neural processing unit 100 performs a complicated computation on a neural network.

FIGS. 6 to 17 are block diagrams showing an electronic apparatus according to an exemplary embodiment of the inventive concept.

Figure 6:
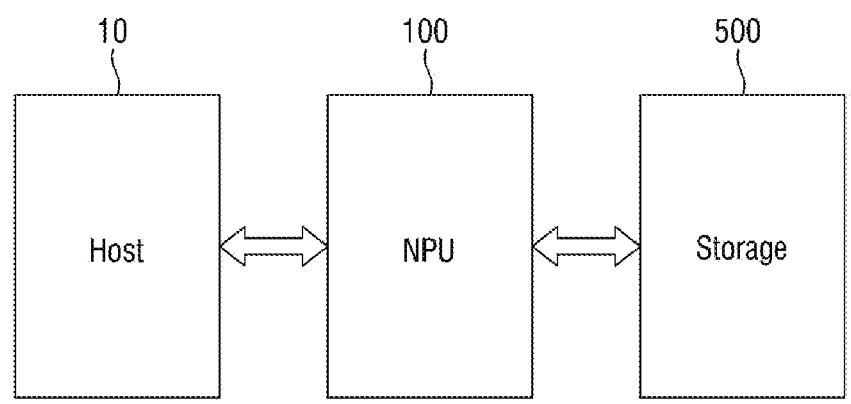
FIG. 6 is a block diagram showing an operating method of a neural processing unit according to an exemplary embodiment of the inventive concept.
Figure 7:
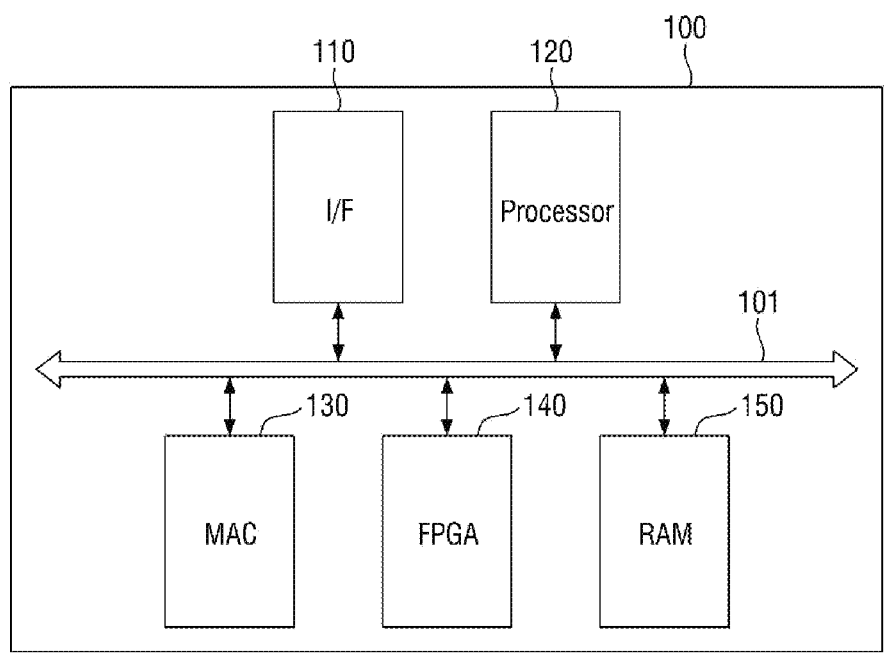
FIGS. 7 to 19 are block diagrams showing an electronic apparatus according to some exemplary embodiments of the inventive concept.
Figure 8:
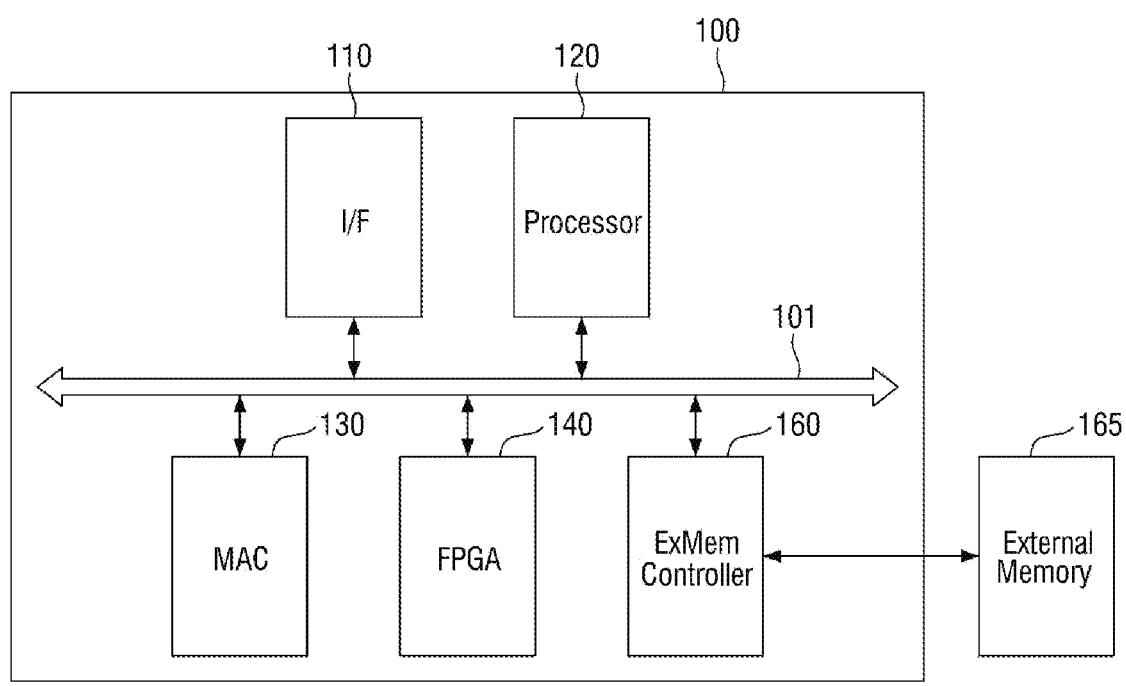

FIG. 6 is a block diagram showing an electronic apparatus according to an exemplary embodiment of the inventive concept, FIG. 7 is a block diagram showing a neural processing unit shown in FIG. 6 according to an exemplary embodiment, and FIG. 8 is a block diagram showing a neural processing unit shown in FIG. 6 according to an exemplary embodiment.

Referring to FIG. 6, the electronic apparatus 1 includes a host 10 (e.g., a host device), a neural processing unit 100, and a storage device 500.

The host 10 may include one of the IPs as shown in FIG. 1. For example, the host 10 may be a central processing unit (CPU), an application processor (AP), or a graphics processing unit (GPU) for performing the overall operation of the electronic apparatus 1. The storage device 500 may include a plurality of non-volatile memory devices. As an example, the non-volatile memory devices may include a flash memory or a resistive memory such as a resistive random access memory (ReRAM), a phase change RAM (PRAM), and a magnetic RAM (MRAM). Also, the non-volatile memory devices may include an integrated circuit including a processor and a RAM, for example, a storage device or a processing-in-memory (PIM).

In some embodiments, the flash memory included in the non-volatile memory devices may be a two-dimensional (2D) or a three-dimensional (3D) memory array. The 3D memory array may be monolithically formed at a physical level of at least one of memory cell arrays having an active region disposed on a silicon substrate and a circuit associated with the operations of memory cells and formed on or in the substrate. The term "monolithic" means that layers at levels of the array are each stacked directly above layers at lower levels. The 3D memory array includes vertical NAND strings disposed in a vertical direction such that at least one memory cell is placed above other memory cells. The memory cell may include a charge trap layer.

Referring to FIG. 7, the neural processing unit 100 according to an exemplary embodiment of the inventive concept includes an interface circuit 110, a processor 120, a multiply-accumulate calculator (MAC) 130, an FPGA 140, and a memory 150. In an exemplary embodiment, the MAC 130 is implemented by a floating-point unit or a math coprocessor.

In an exemplary embodiment, each of the interface circuit 110, the processor 120, the MAC 130, the FPGA 140, and the memory 150 may be implemented as a separate semiconductor device, a separate semiconductor chip, a separate semiconductor die, or a separate semiconductor package. Alternatively, some of the interface circuit 110, the processor 120, the MAC 130, the FPGA 140, and the memory 150 may be implemented as one semiconductor device, one semiconductor chip, one semiconductor die, or one semiconductor package. For example, the processor 120 and the MAC 130 may be implemented as one semiconductor package, and the FPGA 140 and the memory 150 may be connected to each other through a high-speed line (e.g., a through-silicon via (TSV)) in the semiconductor package.

A data bus 101 may connect channels between the interface circuit 110, the processor 120, the MAC 130, the FPGA 140, and the memory 150. The data bus 101 may include a plurality of channels. In an exemplary embodiment, the plurality of channels may indicate communication paths that are independently driven and may communicate with apparatuses connected thereto on the basis of the same communication scheme.

The neural processing unit 100 may communicate with an external apparatus as shown in FIG. 1 or 2 through the interface circuit 110. The interface circuit 110 may be based on at least one of various interfaces such as Double Data Rate (DDR), Low-Power DDR (LPDDR), Universal Serial Bus (USB), multimedia card (MMC), peripheral component interconnection (PCI), PCI-Express (PCI-E), Advanced Technology Attachment (ATA), Serial-ATA (SATA), Parallel-ATA (PATA), small computer small interface (SCSI), enhanced small disk interface (ESDI), Integrated Drive Electronics (IDE), Mobile Industry Processor Interface (MIPI), Nonvolatile Memory-express (NVM-e), and Universal Flash Storage (UFS).

The processor 120 (e.g., a central processing unit) may control the operations of the other elements 101, 110, 130, 140, and 150 of the neural processing unit 100 on the basis of the application information N and the data D received from the host 10. For example, the processor 120 may be configured to select a hardware image I from among a plurality of hardware images stored in a memory using the application information N and reconfigure the FPGA 140 using the selected hardware image. The selected hardware image may be associated with a selected one of a plurality of different machine learning algorithms and the application information N may indicate the machine learning algorithm to select.

The MAC 130 may apply weight information W to data obtained through computation by the FPGA 140 to generate a result Out requested by an external apparatus and output the result Out to the external apparatus. According to an exemplary embodiment, the MAC 130 performs a MAC computation to apply the weight information W corresponding to an application information N to the data computed by the FPGA 140 to generate the result Out and then outputs the result Out of the MAC computation.

According to an exemplary embodiment, the FPGA 140 may perform a computation according to a dynamic region 310, that is, a gate array reconfigured according to a hardware image I loaded from an internal memory 150 and may also perform a computation on data according to a static region 320, that is, a fixed gate array.

According to an exemplary embodiment, the internal memory 150 stores a plurality of hardware images I and a plurality of weight information W. Also, the internal memory 150 may store preset information, programs, or commands related to the operation or a state of the neural processing unit 100. According to an exemplary embodiment, the internal memory 150 is a non-volatile RAM.

According to some embodiments, the internal memory 150 is a working memory and may temporarily store received data and application information or may temporarily store results obtained through computations in the processor 120, the MAC 130, and the FPGA 140. According to an exemplary embodiment, the internal memory 150 may be a buffer memory. According to some embodiments, the internal memory 150 may include a cache, a read-only memory (ROM), a programmable ROM (PROM), an erasable PROM (EPROM), an electrically erasable PROM (EEPROM), a phase-change RAM (PRAM), a flash memory, a static RAM (SRAM), or a dynamic RAM (DRAM).

According to an exemplary embodiment, the internal memory 150 includes a first memory configured to store a plurality of hardware images I and a plurality of weight information W and a second memory configured to store other data. According to an exemplary embodiment, the first memory is a non-volatile memory, and the second memory, which is a working memory, is a buffer memory.

Referring to FIG. 8, the neural processing unit 100 according to an exemplary embodiment of the inventive concept includes an interface circuit 110, a processor 120, a MAC 130, an FPGA 140, and an external memory controller 160 connected to an external memory 165. For convenience of description, the following description focuses on differences with FIG. 7, and a description of the same elements as described above will be omitted.

In FIG. 8, the neural processing unit 100 further includes the external memory controller 160 connected to the external memory 165.

According to some embodiments, the external memory 165 may be a non-volatile memory, a buffer memory, a register, or a static random access memory (SRAM). According to an exemplary embodiment, the external memory 165 is a non-volatile memory and stores a plurality of hardware images I and a plurality of weight information W. A corresponding one of the hardware images I may be loaded into the FPGA 140.

The external memory controller 160 may load any one hardware image I from the external memory 400 into the FPGA 140. The external memory controller 160 according to some embodiments may operate under the control of the interface circuit 110, under the control of the processor 120, or under the control of the FPGA 140.

Figure 9:
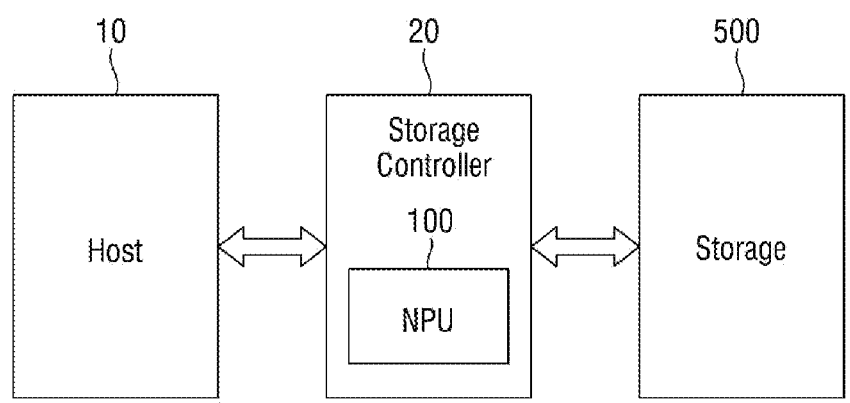

FIG. 9 is a block diagram showing an electronic apparatus according to an exemplary embodiment of the inventive concept, and FIGS. 10 to 16 are block diagrams of a storage controller shown in FIG. 9 according to exemplary embodiments of the inventive concept. For convenience of description, the following description focuses on differences with FIG. 6, and a description of the same elements as described above will be omitted.

Referring to FIG. 9, the electronic apparatus 1 includes a host 10, a storage controller 20, and a storage device 500. The storage device 500 may be connected to the storage controller 20 via a dedicated channel. The storage controller 20 includes the neural processing unit 100. The neural processing unit 100 of FIG. 2 may be the neural processing unit 100 of FIG. 10, the FPGA 300 of FIG. 2 may be the FPGA 25 of FIG. 10, and the memory 200 of FIG. 2 may be the storage device 500 of FIG. 10.

The storage controller 20 may control the operation of the storage device 500. In an exemplary embodiment, a storage controller 20 is connected to the storage device 500 through at least one channel to write or read data. According to some embodiments, the storage controller 20 may be an element provided in the storage device 500 such as a solid-state drive (SSD) or a memory card.

Figure 10:
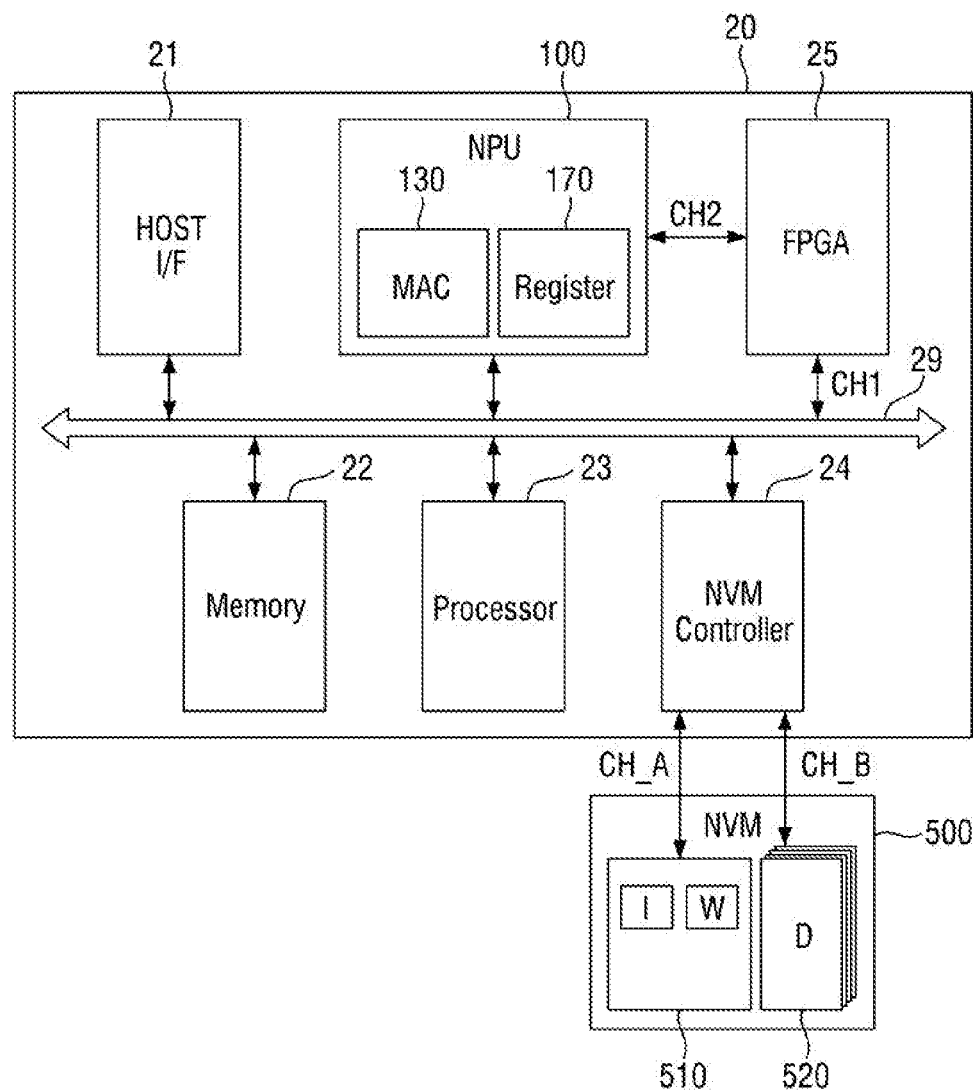

In FIG. 10, the storage controller 20 according to an exemplary embodiment includes a host interface 21, an internal memory 22, a processor 23, a non-volatile memory controller 24, a neural processing unit 100, and an FPGA 25 which are connected to each other through a data bus 29.

The data bus 29 may include a plurality of channels. In an example embodiment, the plurality of channels may indicate communication paths that are independently driven and may communicate with apparatuses connected thereto on the basis of the same communication scheme.

The host interface 21 may be based on at least one of various interfaces such as DDR, LPDDR, USB, MMC, PCI, PCI-E, ATA, SATA, PATA, SCSI, ESDI, IDE, MIPI, NVMe, and UFS.

The internal memory 22, which is a working memory, may be a buffer memory. According to some embodiments, the internal memory 22 may include a cache, a ROM, a PROM, an EPROM, an EEPROM, a PRAM, a flash memory, an SRAM, or a DRAM.

According to some embodiments, the internal memory 22 may be a working memory of the storage controller 20 or a working memory of the neural processing unit 100.

The processor 23 may control the overall operation of the storage controller 20.

The non-volatile memory controller 24 accesses the storage device 500 to control the operation of the plurality of non-volatile memories. In an exemplary embodiment, the non-volatile memory controller 24 is connected to the non-volatile memory device 200 through at least one channel to write, read, or delete data.

The storage device 500 includes a plurality of non-volatile memory apparatuses. The storage device 500 may include a first non-volatile memory 510 configured to store a plurality of hardware images I and a plurality of weight information W and a second non-volatile memory 520 configured to store other data regarding the writing, reading, or deletion. According to some embodiments, the first non-volatile memory 510 may allow reading only and may allow writing or deleting only when a user has a predetermined authority. In an example embodiment, the predetermined authority may be a setting authority or an update authority for the electronic apparatus 1.

According to an exemplary embodiment of the inventive concept, the non-volatile memory controller 24 is connected to the first non-volatile memory 510 through a first channel CH_A and is connected to the second non-volatile memory 520 through a second channel CH_B. The first channel CH_A and the second channel CH_B may be independent channels. When accessing the plurality of hardware images I and the plurality of weight information W, the neural processing unit 100 may perform an efficient computation using the first channel CH_A independently. The first channel CH_A and the second channel CH_B may be included within a dedicated channel that only connects the non-volatile memory controller 24 to the storage device 500.

According to some embodiments, unlike FIG. 10, the non-volatile memory controller 24 may be connected to the first non-volatile memory 510 and the second non-volatile memory 520 through a common channel.

According to the embodiment illustrated in FIG. 10, the neural processing unit 100 includes the MAC 130 and the register 170. In an exemplary embodiment, the register is 170 is replaced with an SRAM.

The MAC 130 may apply weight information W to data obtained through computation by the FPGA 25 and may output a result requested by an external apparatus.

The register 170 may store the data obtained through the computation by the FPGA 25 and may store a result to which the weight information W is applied. That is, the register 170 may be a working memory for the MAC 130.

The FPGA 25 may be connected to elements connected to the data bus 29 through a first channel CH1 and may be connected to the neural processing unit 100 through the second channel CH2. That is, the FPGA 25 may be shared with the neural processing unit 100 and the storage controller 20. In an exemplary embodiment, the neural processing unit 100 is directly connected to the FPGA 25 through the second channel CH2. For example, a result of an operation performed by the FPGA 25 may be output directly to the neural processing unit 100 through the second channel CH2. For example, the neural processing unit 100 may perform an operation and provide the result directly to the FPGA 25 through the second channel CH2 (e.g., a signal line different from a signal line used for bus 29) for further processing by the FPGA 25.

According to an exemplary embodiment, when the first channel CH1 and the second channel CH2 are independent, the FPGA 25 may efficiently perform a computation requested by the neural processing unit 100 through the second channel CH2 that is directly connected to the neural processing unit 100.

According to an exemplary embodiment, the FPGA 25 may load a hardware image I and perform a computation based on a request of the storage controller 20 or the host 10 received through the first channel CH1.

Figure 11:
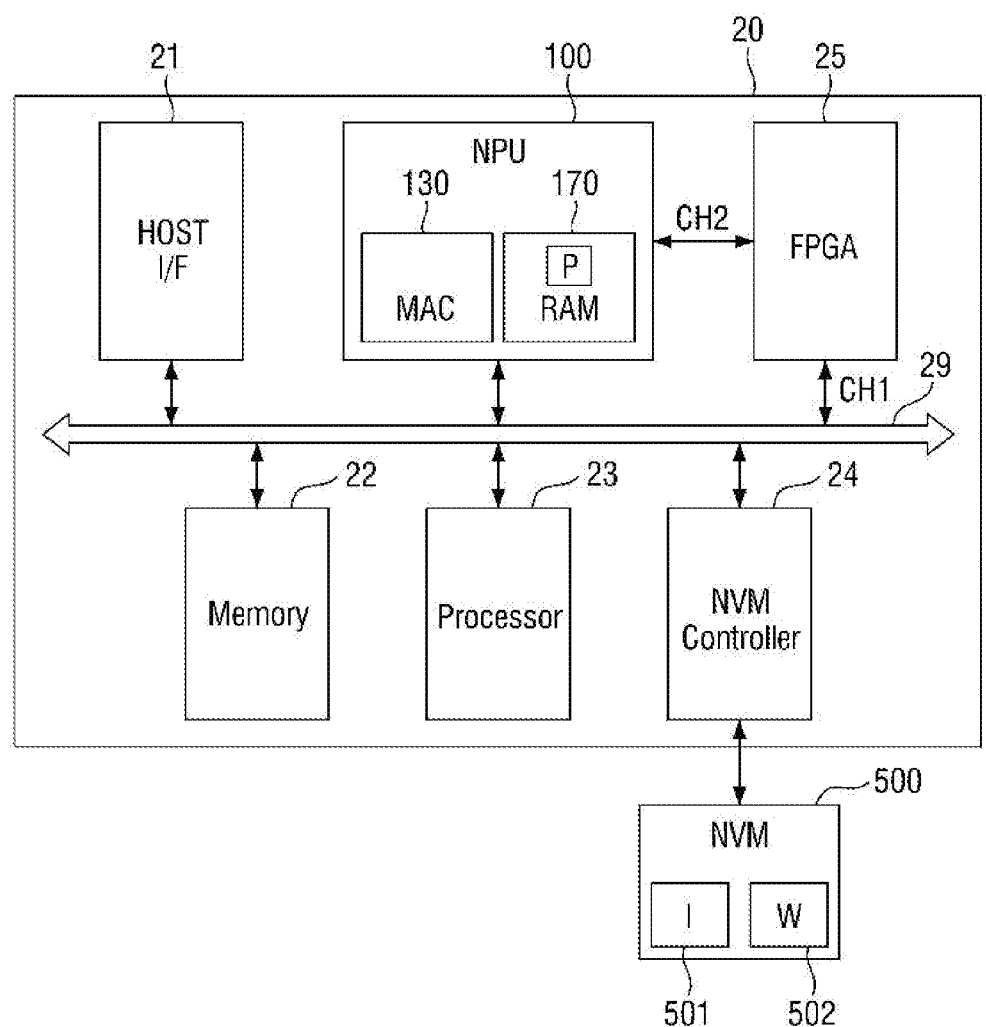

In FIG. 11, the storage controller 20 according to an exemplary embodiment of the inventive concept includes a host interface 21, an internal memory 22, a processor 23, a non-volatile memory controller 24, a neural processing unit 100, and an FPGA 25 which are connected to each other through a data bus 29. The neural processing unit 100 of FIG. 2 may be the neural processing unit 100 of FIG. 11, the FPGA 300 of FIG. 2 may be the FPGA 25 of FIG. 11, and the memory 200 of FIG. 2 may be the storage device 500 of FIG. 11. For convenience of description, the following description focuses on differences with FIG. 10, and a description of the same elements as described above will be omitted.

In the embodiment illustrated in FIG. 11, the neural processing unit 100 includes a MAC 130 and an internal memory 170.

According to an exemplary embodiment of the inventive concept, the internal memory 170 includes storage information P indicating positions where a plurality of hardware images I and a plurality of weight information W are stored.

According to an exemplary embodiment of the inventive concept, the storage information P may be pointers for the positions where the plurality of hardware images I and the plurality of weight information W are stored. That is, the storage information P may indicate the storage positions where a plurality of hardware images 501 and a plurality of weight information 502 are stored in the storage device 500. The non-volatile memory controller 24 may access the storage device 500 based on the storage information P and may read at least one hardware image I and at last one weight information W.

Also, according to some embodiments, the internal memory 170 may be a working memory for the MAC 130.

According to some embodiments, the internal memory 170 may include a cache, a ROM, a PROM, an EPROM, an EEPROM, a PRAM, a flash memory, an SRAM, or a DRAM.

According to an example embodiment, the internal memory 170 may include a first memory configured to store the storage information P and include a second memory as a working memory. The first memory may be a non-volatile memory.

Figure 12:
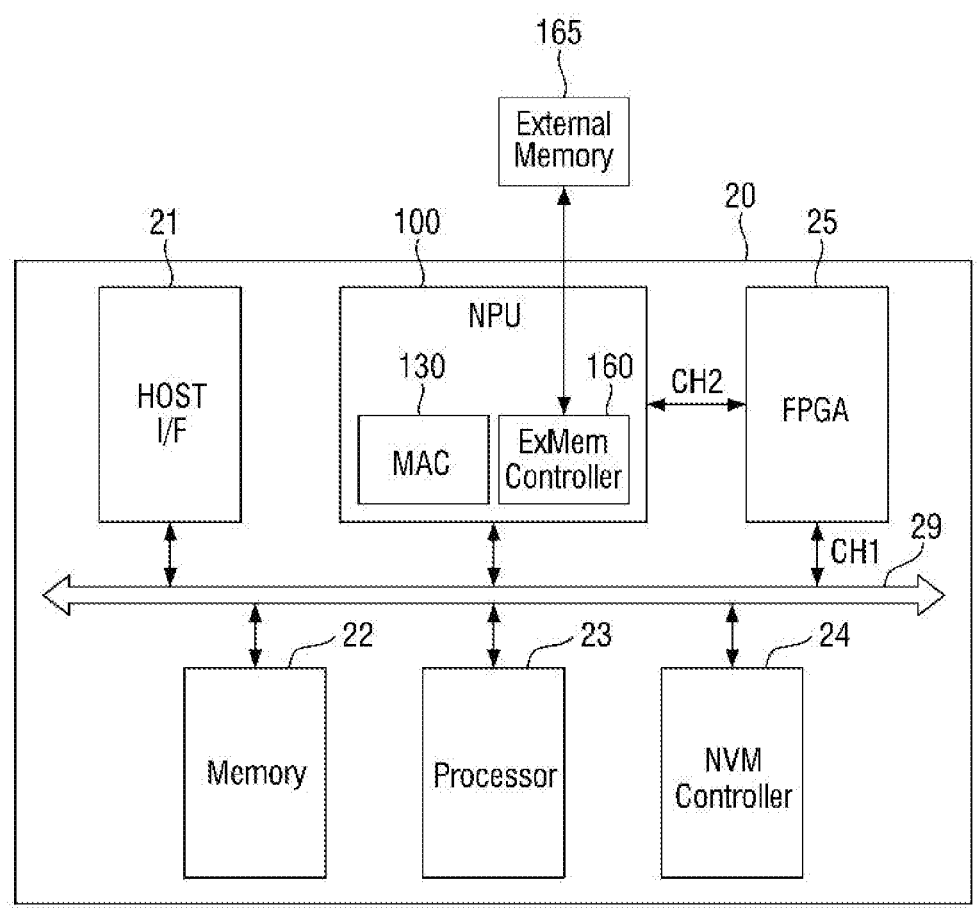

In FIG. 12, the storage controller 20 according to an exemplary embodiment of the inventive concept includes a host interface 21, an internal memory 22, a processor 23, a non-volatile memory controller 24, a neural processing unit 100, and an FPGA 25 which are connected to each other through a data bus 29. The neural processing unit 100 of FIG. 2 may be the neural processing unit 100 of FIG. 12, the FPGA 300 of FIG. 2 may be the FPGA 25 of FIG. 12, and the memory 200 of FIG. 2 may be the external memory 165 of FIG. 12. For convenience of description, the following description focuses on differences with FIGS. 10 and 11, and a description of the same elements as described above will be omitted.

As illustrated in FIG. 12, the neural processing unit 100 includes a MAC 130 and an external memory controller 160.

The external memory controller 160 is connected to an external memory 165 to control the overall operation of the external memory 165. According to an example embodiment, the external memory controller 160 may read or delete data stored in the external memory 165 or may write new data into the external memory 165.

The external memory 165 may store data related to the neural processing unit 100. In an exemplary embodiments, the external memory 165 stores the plurality of hardware images I and the plurality of weight information W. The external memory 165 may also store one or more neural networks, or functions executed by nodes of the neural networks, which may be executed by the neural processing unit 100.

The FPGA 25 may load at least one hardware image I among the plurality of hardware images I stored in the external memory 165. The FPGA 25 may receive the hardware image I to be loaded through the second channel CH2.

Figure 13:
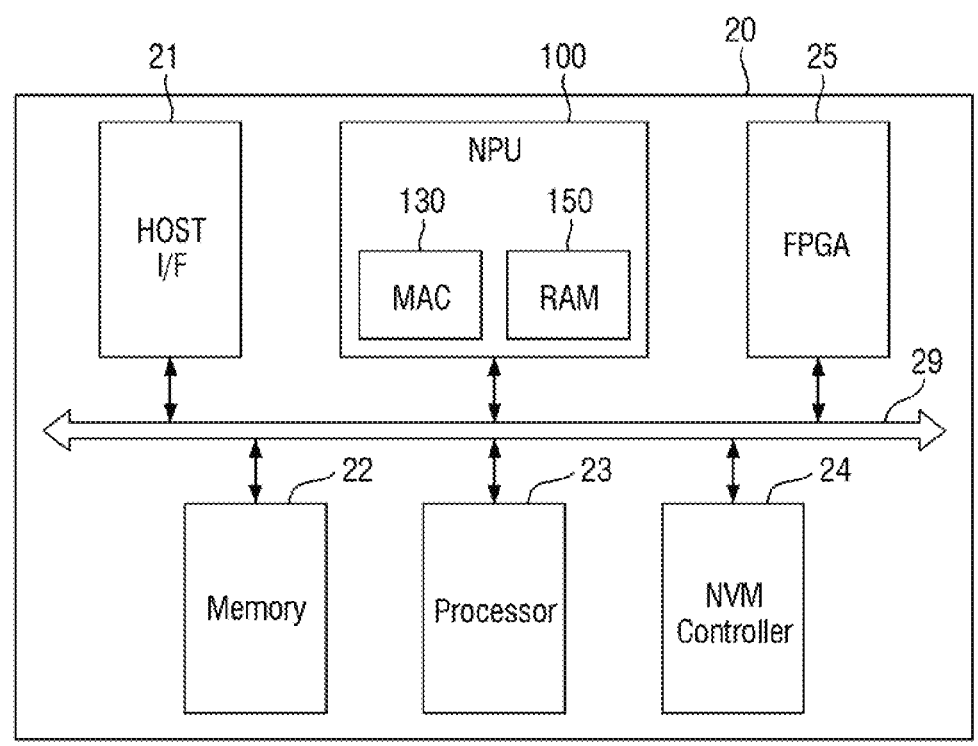

In FIG. 13, the storage controller 20 according to an exemplary embodiment of the inventive concept includes a host interface 21, an internal memory 22, a processor 23, a non-volatile memory controller 24, a neural processing unit 100, and an FPGA 25 which are connected to each other through a data bus 29. The neural processing unit 100 of FIG. 2 may be the neural processing unit 100 of FIG. 13, the FPGA 300 of FIG. 2 may be the FPGA 25 of FIG. 13, and the memory 200 of FIG. 2 may be the internal memory 150 of FIG. 13. For convenience of description, the following description focuses on differences with FIGS. 10 to 12, and a description of the same elements as described above will be omitted.

The neural processing unit 100 includes the MAC 130 and the internal memory 150. According to an exemplary embodiment of the inventive concept, the internal memory 150 stores a plurality of hardware images I and a plurality of weight information W. According to some embodiments, the internal memory 150 may be a working memory of the neural processing unit 100. Alternatively, according to some embodiments, the internal memory 150 may include a first memory including the plurality of hardware images I and the plurality of weight information W and a second memory configured to store operational data.

The FPGA 25 may be connected to the elements through a plurality of common channels and may be accessed by the elements through the data bus 29. According to an exemplary embodiment, a gate array of the FPGA 25 may be reconfigured by connecting to the neural processing unit 100 through a selected one of the plurality of channels, receiving the hardware image I through the selected channel and loading the received hardware image I into the FPGA 25. The FPGA 25 having the reconfigured gate array may process data D received from the host interface 21 through any one of the plurality of channels to generate a computation result and output the computation result to the neural processing unit 100 through any one of the plurality of channels.

Figure 14:
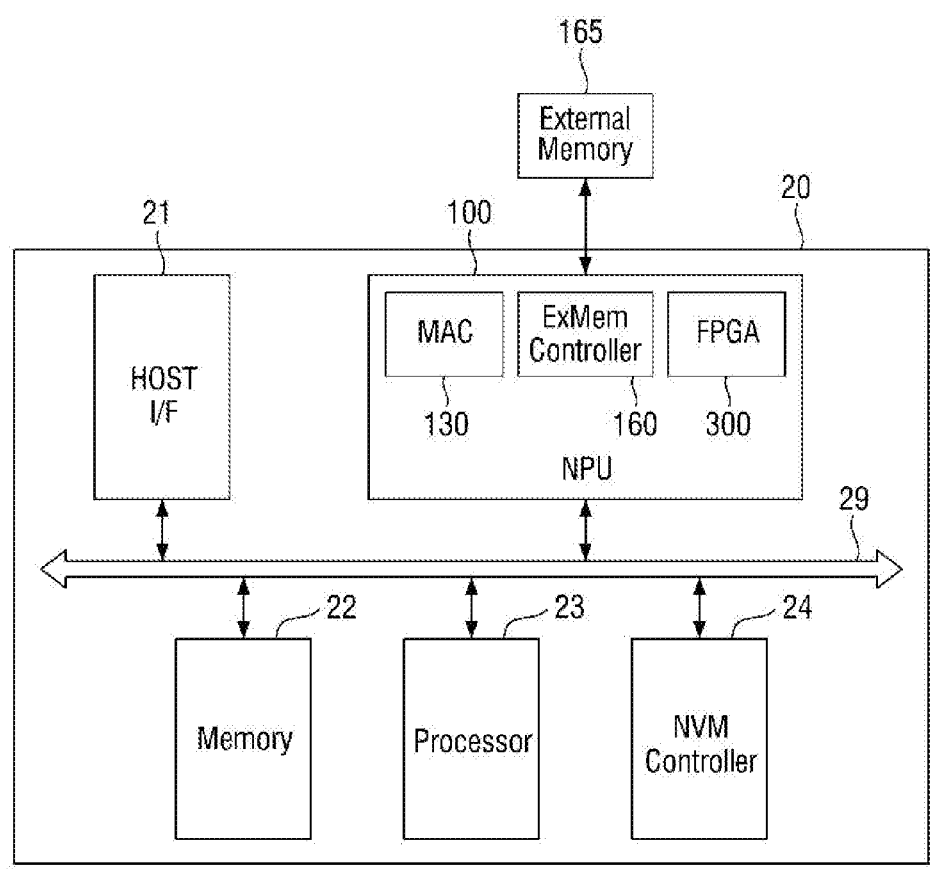

In FIG. 14, the storage controller 20 according to an exemplary embodiment of the inventive concept includes a host interface 21, an internal memory 22, a processor 23, a non-volatile memory controller 24, and a neural processing unit 100 which are connected to each other through a data bus 29. The neural processing unit 100 of FIG. 2 may be the neural processing unit 100 of FIG. 14, the FPGA 300 of FIG. 2 may be the FPGA 300 of FIG. 14, and the memory 200 of FIG. 2 may be the external memory 165 of FIG. 14. For convenience of description, the following description focuses on differences with FIGS. 10 to 13, and a description of the same elements as described above will be omitted.

The neural processing unit 100 according an exemplary embodiment of the inventive concept includes a MAC 130, an external memory controller 160 connected to an external memory 165, and an FPGA 300.

The external memory 165 includes a plurality of hardware images I and a plurality of weight information W. In an exemplary embodiment, the FPGA 300 is only for operations of the neural processing unit 100 and is not shared with other elements of the storage controller 20 as shown in FIGS. 10 to 13.

The FPGA 300 is reconfigured by loading a hardware image I through the external memory controller 165 of the neural processing unit 100, and the reconfigured FPGA 300 performs a computation on data received by the neural processing unit 100.

Figure 15:
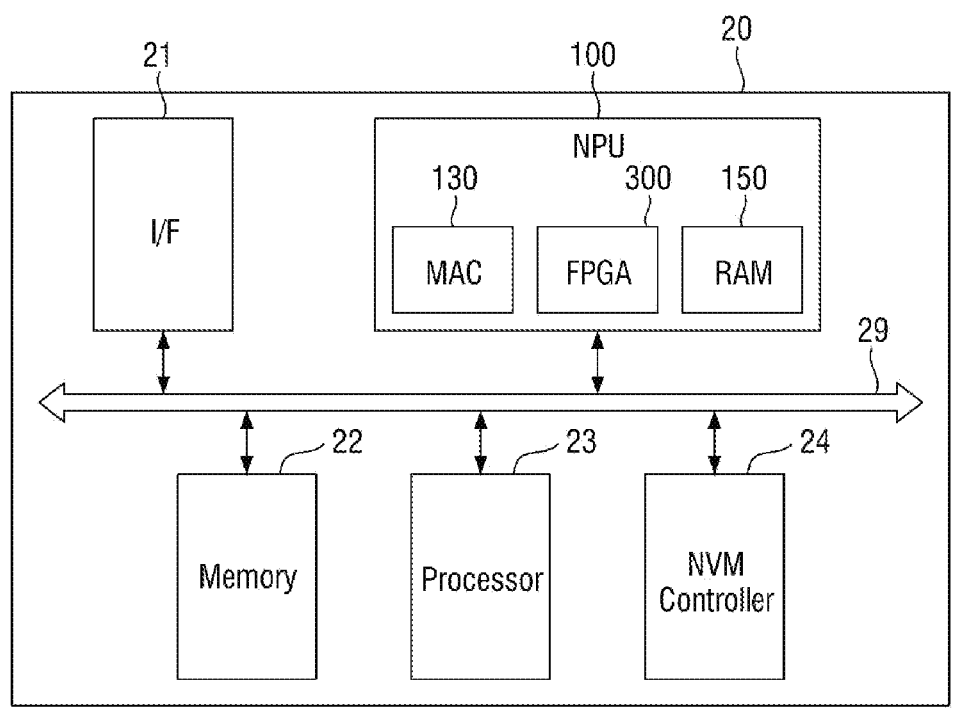

In FIG. 15, the storage controller 20 according to an exemplary embodiment of the inventive concept includes a host interface 21, an internal memory 22, a processor 23, a non-volatile memory controller 24, and a neural processing unit 100 which are connected to each other through a data bus 29. The neural processing unit 100 of FIG. 2 may be the neural processing unit 100 of FIG. 15, the FPGA 300 of FIG. 2 may be the FPGA 300 of FIG. 15, and the memory 200 of FIG. 2 may be the internal memory 150 of FIG. 15. For convenience of description, the following description focuses on differences with FIGS. 10 and 11, and a description of the same elements as described above will be omitted.

According to an exemplary embodiment of the inventive concept, the internal memory 150 stores a plurality of hardware images I and a plurality of weight information W. According to some embodiments, the internal memory 150 may be a working memory of the neural processing unit 100. Alternatively, according to some embodiments, the internal memory 150 may include a first memory including the plurality of hardware images I and the plurality of weight information W and a second memory configured to store operational data.

In an exemplary embodiment, the FPGA 300 according is only for the operation of the neural processing unit 100 and is not shared with other elements of the storage controller 20 as shown in FIG. 14.

Figure 16:
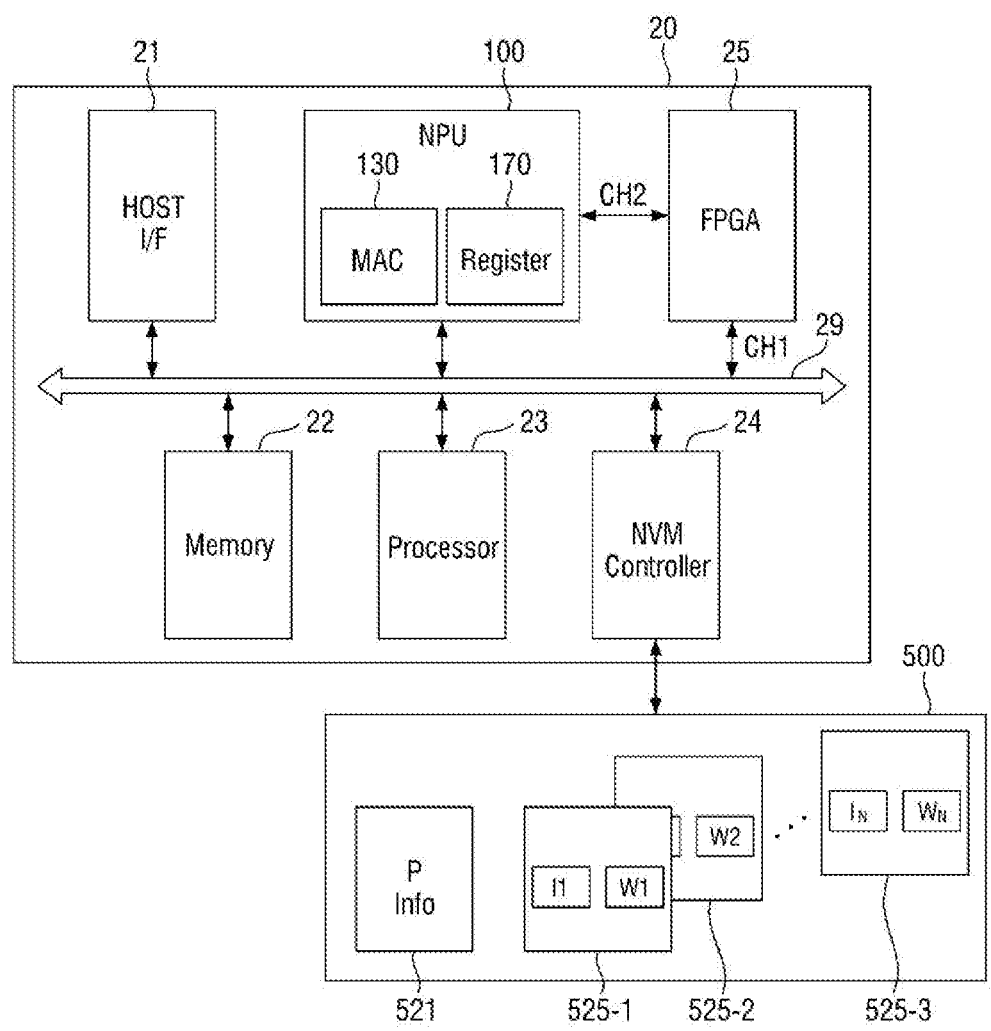

In FIG. 16, the storage controller 20 according to an exemplary embodiment of the inventive concept includes a host interface 21, an internal memory 22, a processor 23, a non-volatile memory controller 24, a neural processing unit 100, and an FPGA 25 which are connected to each other through the data bus 29. The neural processing unit 100 of FIG. 2 may be the neural processing unit 100 of FIG. 16, the FPGA 300 of FIG. 2 may be the FPGA 25 of FIG. 16, and the memory 200 of FIG. 2 may be the storage device 500 of FIG. 16. For convenience of description, the following description focuses on differences with FIGS. 10 to 15, and a description of the same elements as described above will be omitted.

In the embodiment illustrated in FIG. 16, the storage device 500 includes a first non-volatile memory 521 including storage information P and a plurality of second non-volatile memories 525-1, 525-2, and 525-3 configured to store a hardware image I and weight information W in pairs. Each of the second non-volatile memories may include at least one pair of a hardware image and weight information. While FIG. 16 shows that the plurality of second non-volatile memories number three, the inventive concept is not limited to any particular number of second non-volatile memories.

The non-volatile memory controller 24 may ascertain a position where the hardware image I and the weight information W are stored from the storage information P stored in the first non-volatile memory 521, access any one of the plurality of second non-volatile memories, and read a hardware image I and weight information W corresponding to application information. For example, if the storage information P indicates the hardware image I and the weight information W are stored in memory 525-2, then the non-volatile memory controller 24 may retrieve the corresponding information from memory 525-2.

Figure 17:
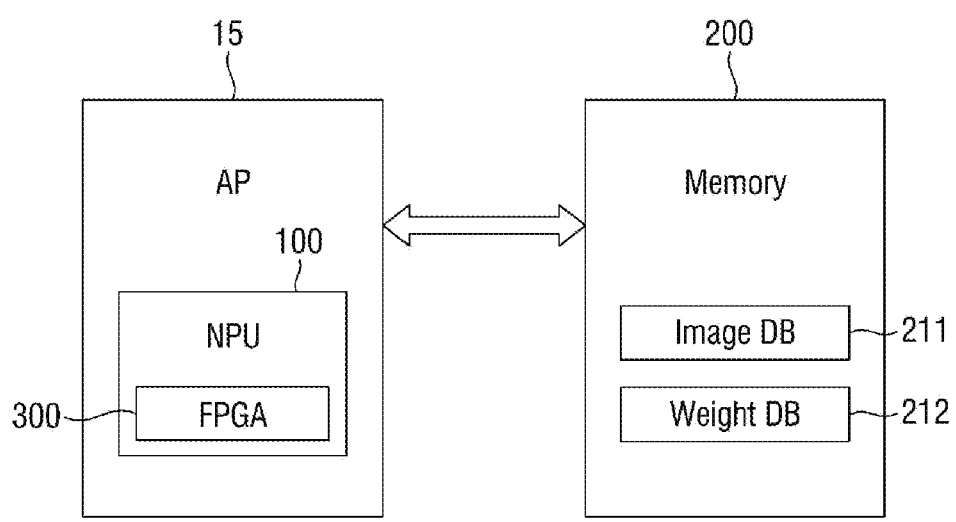

FIG. 17 is a block diagram showing an electronic apparatus according to an exemplary embodiment of the inventive concept.

Referring to FIG. 17, the electronic apparatus 1 includes an application processor 15 and a storage device 200.

The application processor 15 includes a neural processing unit 100. The neural processing unit 100 includes an FPGA 300. The neural processing unit 100 is configured to perform machine learning, that is, complex computations related to a neural network, and the application processor 15 performs computations for other operations unrelated to a neural network.

The application processor 15 may directly access the memory device 200. For example, the application processor 15 may directly access the memory 200 using a channel connecting the application processor 15 to the memory 200.

The memory device 200 may be the memory 200 of FIG. 2. Descriptions overlapping with FIG. 2 will be omitted.

In an exemplary embodiment, the neural processing unit 100 receives application information directly from the application processor 15. According to some embodiments, the application processor 15 may determine a workload to activate and operate only the neural processing unit 100 or to activate and operate both of the neural processing unit 100 and the FPGA 300. For example, if the work load of the neural processing unit 100 is higher than a certain threshold, the application processor may activate the FPGA 300, and otherwise deactivate the FPGA to reduce power consumption.

Figure 18:
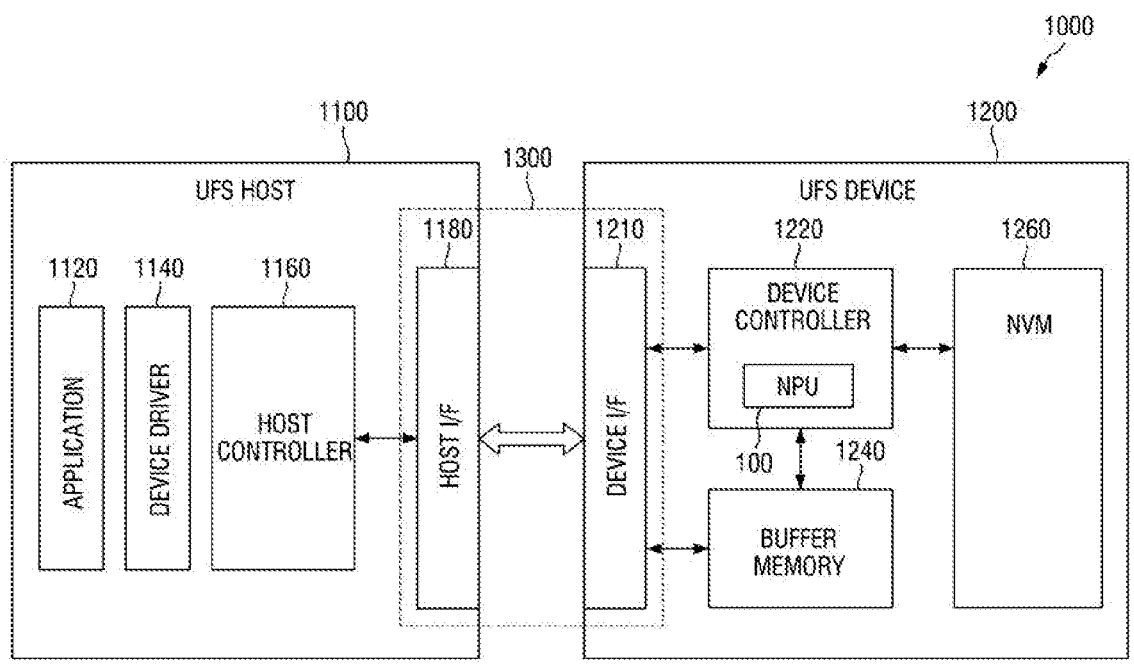

FIG. 18 is a block diagram showing an electronic apparatus according to an exemplary embodiment of the inventive concept.

Referring to FIG. 18, the electronic apparatus may be a universal flash storage (UFS) system. A UFS system 1000 includes a UFS host 1100 (e.g., a host device) and a UFS apparatus 1200. The UFS host 1100 and the UFS apparatus 1200 may be connected to each other through a UFS interface 1300. The UFS system 1000 is based on a flash memory, which is a non-volatile memory device. For example, the UFS system 100 may be used in a mobile device such as a smartphone.

The UFS host 1100 includes an application 1120, a device driver 1140, a host controller 1160, and a host interface 1180.

The application 1120 may include various application programs to be executed by the UFS host 1100. The device driver 1140 may be for driving peripheral devices connected to the UFS host 1100 and may drive the UFS apparatus 1200. The application 1120 and the device driver 1140 may be implemented in software or firmware.

The host controller 1160 (e.g., a control circuit) may generate a protocol or command to be provided to the UFS apparatus 1200 according to a request from the application 1120 and the device driver 1140 and may provide the generated command to the UFS apparatus 1200 through the host interface 1180 (e.g., an interface circuit). When a write request is received from the device driver 1140, the host controller 1160 provides a write command and data to the UFS device 1200 through the host interface 1180. When a read request is received, the host controller 1160 provides a read command to the UFS apparatus 1200 through the host interface 1180 and receives data from the UFS apparatus 1200.

In an exemplary embodiment, the UFS interface 1300 uses a serial advanced technology attachment (SATA) interface. In an embodiment, the SATA interface is divided into a physical layer, a link layer, and a transport layer depending on the function.

A host-side SATA interface 1180 includes a transmitter and a receiver, and a UFS-apparatus-side SATA interface 1210 includes a receiver and a transmitter. The transmitters and receivers correspond to the physical layer of the SATA interface. The transmitting part of the host-side SATA interface 1180 is connected to the receiving part of the UFS-apparatus-side SATA interface 1210, and the transmitting part of the UFS-apparatus-side SATA interface 1210 may be connected to the receiving part of the host-side SATA interface 1180.

The UFS apparatus 1200 may be connected to the UFS host 1100 through a device interface 1210 (e.g., interface circuit). The host interface 1180 and the device interface 1210 may be connected to each other through a data line for sending and receiving data or signals and a power supply line for providing power.

The UFS apparatus 1200 includes a device controller 1220 (e.g., control circuit), a buffer memory 1240, and a non-volatile memory device 1260. The device controller 1220 may control an overall operation of the non-volatile memory device 1260 such as writing, reading, and erasing. The device controller 1220 may send and receive data to and from the buffer memory 1240 or the non-volatile memory device 1260 through address and data buses. The device controller 1220 may include at least one of a central processing unit (CPU), a direct memory access (DMA) controller, flash DMA controller, a command manager, a buffer manager, a flash translation layer (FTL), and a flash manager.

The UFS apparatus 1200 may provide a command received from the UFS host 1100 to the device DMA controller and the command manager through the device interface 1210, and the command manager may allocate the buffer memory 1240 such that data is input through the buffer manager and then may send a response signal to the UFS host 1100 when data is ready to be transmitted.

The UFS host 1100 may transmit data to the UFS apparatus 1200 in response to the response signal. The UFS apparatus 1200 may store the transmitted data in the buffer memory 1240 through the device DMA controller and the buffer manager. The data stored in the buffer memory 1240 may be provided to the flash manager through the flash DMA controller, and the flash manager may store the data in a selected address of the non-volatile memory device 1260 by referring to address mapping information of the flash translation layer (FTL).

When data transmission and a program necessary for a command of the UFS host 1100 are complete, the UFS apparatus 1200 sends a response signal to the UFS host 1100 through the device interface 1210 and informs the UFS host 1100 of the command completion. The UFS host 1100 may inform the device driver 1140 and the application 1120 of whether the command corresponding to the received response signal has completed and may terminate the corresponding command.

The device controller 1220 and the non-volatile memory device 1260 in the UFS system 2400 may include the neural processing unit 100, the storage controller, and the memory 200 that have been described with reference to FIGS. 1 to 17. The device controller 1220 may include the neural processing unit 100.

In some embodiments, the non-volatile memory device 1260 may include the memory 200. Alternatively, in some embodiments, the device controller 1220 may include the memory 200. Alternatively, in some embodiments, the memory 200 may be an external memory connected to the neural processing unit 100 in the device controller 1220. In some embodiments, the FPGA 300 may be included in the neural processing unit 100. Alternatively, in some embodiments, the FPGA 300 may be included in the device controller 1220 and connected to the neural processing unit 100.

Figure 19:
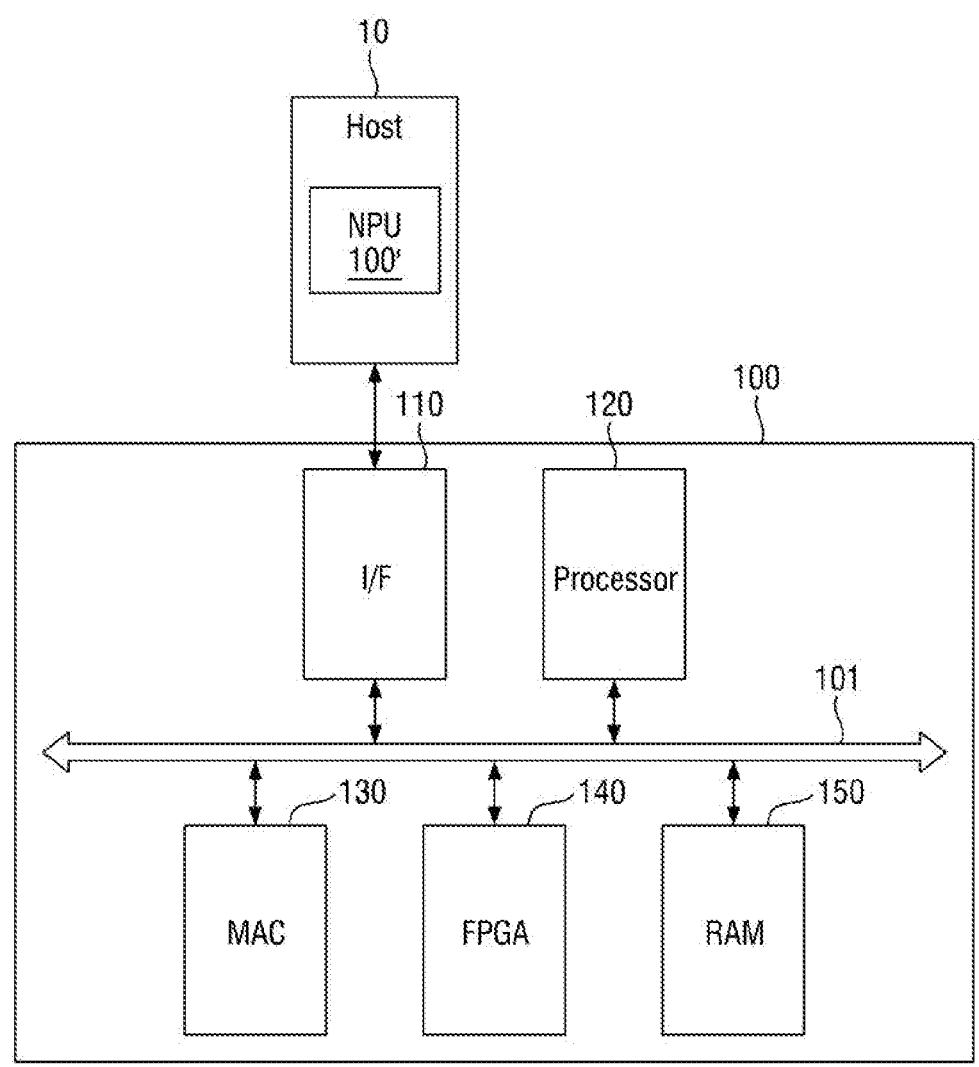

FIG. 19 illustrates an exemplary embodiment of an apparatus including the host device 10 and then NPU 100 depicted in FIG. 7 or FIG. 8. Alternately, the NPU 100 depicted in FIG. 19 may be replaced with the NPU 20 depicted in FIG. 10, FIG. 11, FIG. 12, FIG. 13, FIG. 14, FIG. 15, or FIG. 16. The host device 10 additionally incudes its own NPU 100'. The NPU 100' may be referred to as a main NPU while NPU 10 may be referred to as a subordinate or sub NPU. In this embodiment, work may be split across the main NPU and the sub NPU. For example, the host device 10 may use the main NPU to perform part of a neural processing operation and then offset a remainder of the neural processing operation to the sub NPU. For example, the host device 10 may output a command and data to the interface circuit 110, and the interface circuit 110 may forward the command and data to the processor 120 to execute the command on the data itself or using the FPGA 140 and/or the MAC 130. The processor 120 may reconfigure the FPGA 140 as described above if execution of the command requires a new hardware image. In another exemplary embodiment, the main NPU is configured to perform a machine learning operation or algorithm of a certain type (e.g., for image recognition, speech recognition, etc.) of a first accuracy level and the sub NPU is configured to perform the machine learning operation or algorithm of the same type but of a second accuracy that is lower than the first accuracy. For example, the machine learning operation or algorithm of the first accuracy level takes longer to execute than the machine learning operation or algorithm of the second accuracy level. For example, when a workload of the host device 10 is lower that a certain threshold, the host device 10 may use the main NPU to execute the machine learning algorithm. However, when the workload of the host device 10 exceeds the certain threshold, then the host device 10 offloads some operations of the machine learning algorithm or all operations of the machine learning algorithm to the sub NPU. In an exemplary embodiment, the main NPU is implemented to have the same structure as NPU 100 or NPU 20.

In concluding the detailed description, those of ordinary skill in the art will appreciate that many variations and modifications may be made to the exemplary embodiments without substantially departing from the principles of the present inventive concept.

What is claimed is:
1. A storage device comprising:
an interface circuit configured to receive application information from a host;
a field programmable gate array (FPGA) including a dynamic region and a static region;
a neural processing unit (NPU); and
a central processing unit (CPU) configured to select a hardware image from among a plurality of hardware images stored in a memory using the application information, and reconfigure the dynamic region of the FPGA through the selected hardware image,
wherein the NPU is configured to perform a first operation using the reconfigured dynamic region of the FPGA,
wherein the static region of the FPGA is configured to perform a second operation without loading the hardware image when the second operation is performed more frequently than the first operation and the second operation is a non-linear operation.

2. The storage device of claim 1, wherein the selected hardware image is associated with a selected one of a plurality of different machine learning algorithms and the application information indicates the machine learning algorithm to select.

3. The storage device of claim 2, wherein the reconfigured FPGA performs a pre-computation on data input to the neural processing unit for the selected machine learning algorithm to generate a value and the neural processing unit performs the selected machine learning algorithm on the value using weight data stored in the memory to generate a result.

4. The storage device of claim 3, further comprising a multiply-accumulate calculator (MAC) configured to perform the selected machine learning algorithm on the value using the weight data to generate the result.

5. The storage device of claim 2, wherein the NPU performs the selected machine learning algorithm on input data using weight data stored in the memory to generate a value, and the reconfigured FPGA performs a post-computation on the value to generate a result.

6. The storage device of claim 2, wherein the reconfigured FPGA performs the selected machine learning algorithm on input data using weight data stored in the memory to generate a result.

7. The storage device of claim 1, wherein the memory is a static random access memory (SRAM) or a register located within the NPU.

8. The storage device of claim 1, further comprising a non-volatile memory controller connected to the memory and the memory is located outside a controller including the NPU, the CPU, and the FPGA.

9. A method of operating a neural processing unit (NPU), the method comprising:
receiving, by the NPU, application information and data from a host device;
selecting, by the NPU, one of a plurality of hardware images from a memory by referencing an entry of a mapping table using the application information;
loading, by the NPU, the selected hardware image to a field programmable gate array (FPGA) within the NPU to configure the FPGA; and
performing, by the NPU, a machine learning algorithm associated with the application information on the data to generate a result using the configured FPGA.

10. The method of claim 9, wherein the loading configures a dynamic region of the FPGA using the selected hardware image and maintains a static region of the FPGA.

11. The method of claim 9, wherein the performing comprises:
loading weight data from the memory;
executing the machine learning algorithm on the data using the loaded weight data stored to generate a value; and
directing the configured FPGA to perform a post-computation on the value to generate the result.

12. The method of claim 9, wherein the performing comprises:
loading weight data from the memory;
directing the configured FPGA to perform a pre-computation on the data to generate a value; and
performing the machine learning algorithm on the value using the loaded weight data to generate the result.

13. A storage device comprising:
an interface circuit configured to receive application information from a host;
a field programmable gate array (FPGA);
a neural processing unit (NPU); and
a central processing unit (CPU) configured to select a hardware image from among a plurality of hardware images stored in a memory using the application information, and reconfigure the FPGA using the selected hardware image,
wherein the NPU is configured to perform a first operation using the reconfigured FPGA when a work load of the NPU is higher than a threshold, and performs a second operation different from the first operation without using the reconfigured FPGA when the work load is not higher than the threshold.

* * * * *